(12) United States Patent
Allen et al.

(10) Patent No.: US 6,651,229 B2
(45) Date of Patent: Nov. 18, 2003

(54) GENERATION OF REFINED SWITCHING WINDOWS IN STATIC TIMING ANALYSIS

(75) Inventors: Robert J. Allen, Jericho, VT (US); Ravishankar Arunachalam, Austin, TX (US); David J. Hathaway, Underhill Center, VT (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 09/682,707

(22) Filed: Oct. 9, 2001

(65) Prior Publication Data

US 2003/0070150 A1 Apr. 10, 2003

(51) Int. Cl.[7] .............................................. G06F 17/50
(52) U.S. Cl. .................................. 716/6; 716/4; 716/5
(58) Field of Search ..................... 716/6, 5, 4

(56) References Cited

U.S. PATENT DOCUMENTS

| 5,507,029 A | 4/1996 | Granato et al. |
| 5,636,372 A | 6/1997 | Hathaway et al. |
| 5,751,596 A | 5/1998 | Ginetti et al. |
| 5,825,658 A | 10/1998 | Ginetti et al. |
| 5,983,006 A | 11/1999 | Carlson et al. |
| 6,018,254 A | 1/2000 | Rogers et al. |
| 6,074,429 A | 6/2000 | Pullela et al. |

OTHER PUBLICATIONS

Arunachalam et al., "TACO: Timing Analysis With COupling*", IEEE, 2000.*
Hassoun, "Critical Path Analysis Using a Dynamically Bounded Delay Model*", IEEE, 2000.*
Sasaki et al., "Crosstalk Delay Analysis usig Relative Window Method", IEEE, 1999.*

* cited by examiner

*Primary Examiner*—Leigh M. Garbowski
*Assistant Examiner*—Brandon Bowers
(74) *Attorney, Agent, or Firm*—McGinn & Gibb, PLLC; Richard M. Kotulak, Esq.

(57) ABSTRACT

A method and structure to determine timing windows in a static timing analysis of an integrated circuit design, determines for at least one node in the integrated circuit design, an initial set of sub-windows and merges the sub-windows of the initial set into a final set of sub-windows.

38 Claims, 6 Drawing Sheets

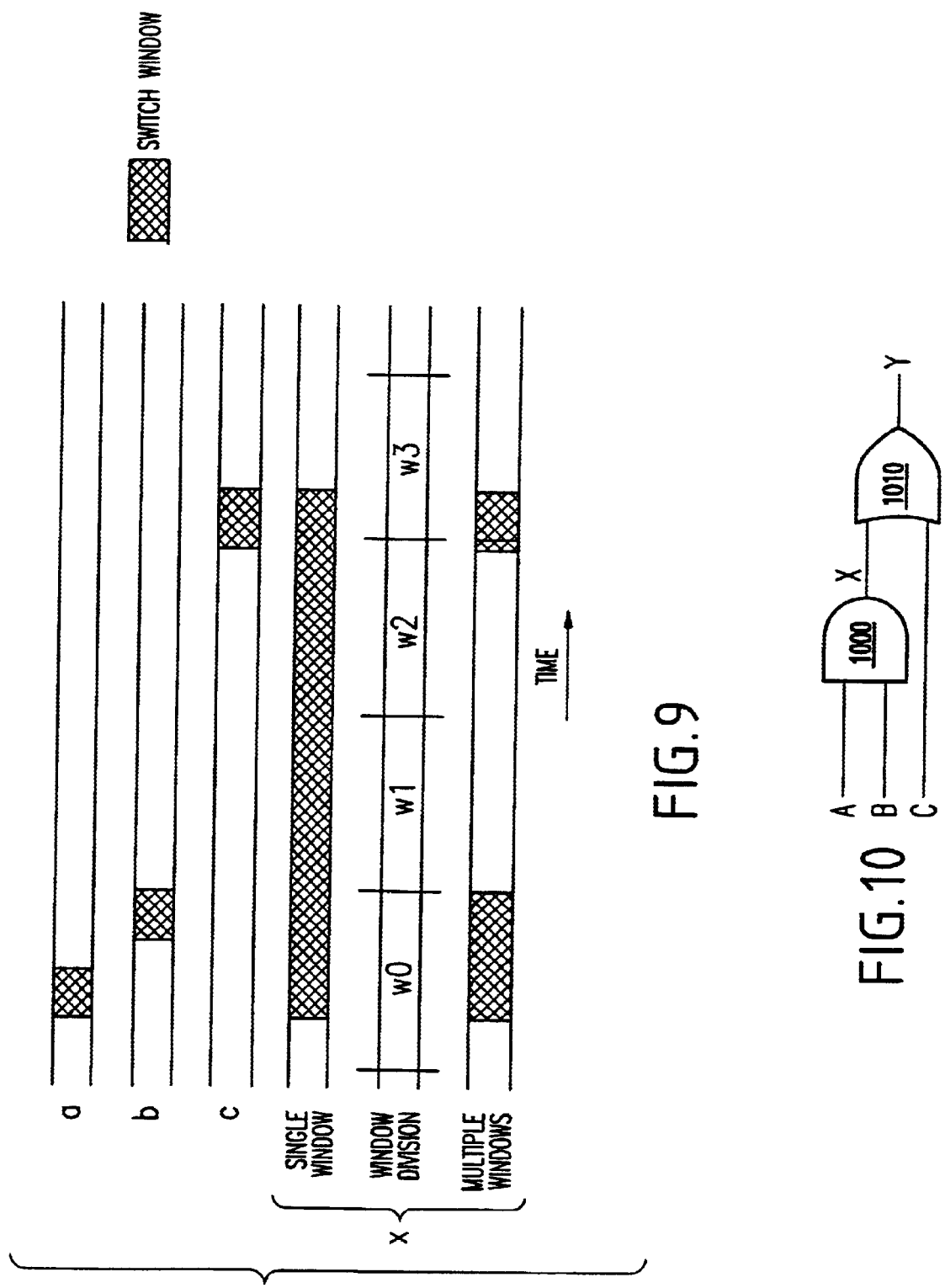

US 6,651,229 B2

GENERATION OF REFINED SWITCHING WINDOWS IN STATIC TIMING ANALYSIS

BACKGROUND OF THE INVENTION

1. Field of the Invention

The present invention generally relates to circuit timing analysis and more particularly to an improved circuit timing analysis that reduces delay pessimism by using multiple switching windows.

2. Description of the Related Art

During the design phase of electronic signal processing equipment, such as integrated circuit chips, the timing at which different signals pass through various portions of the device must be studied to ensure that the device operates as planned. For example, it is important to analyze the design of the device so as to make sure the flow of signals reach their destination at the proper time. This is necessary to maintain the proper logical operations of the electronic device. In addition, the circuit designer needs to account for (and if possible to avoid) situations where concurrent signal transitions occur on closely spaced electrical wires, because such a situation could delay the transmission of the signals along their respective wires as a result of the unavoidable capacitive coupling between such closely spaced wires.

As the number of logical devices within each integrated circuit chip increases, the number of signal paths which may lead to a specific logical device ("fan-in") and the number of signal paths to which a specific logic of device may pass a signal ("fan-out") increases exponentially. In order to maintain the timing of the various signals within the boundaries prescribed by the circuit designer and to identify situations in which concurrent signal transitions occur on closely spaced wires, conventional timing analysis systems create a logical "window" in which a signal can be expected to arrive at a given logical device given the fan-in to that device. This window increases as the size and complexity of the fan-in leading to the logical device increases.

Conventional static timing analysis operates on a timing graph representing an abstraction of the logic network within an integrated circuit. The abstraction consists of nodes at which arrival times (ATs), required arrival times (RATs), and/or slews are computed, and directed delay edges on which delays connecting these nodes are computed. Normally both early mode and late mode values are computed, and test edges may be present in the delay graph representing ordering requirements between the early and late mode ATs on the pair of nodes connected by the test edge.

The times (ATs and RATs) computed by static timing analysis are normally made with respect to some specific time within a repeating clock cycle. The early mode AT represents the earliest that the signal at the node can change from the stable value which it held during the previous clock cycle and its value at a node is computed as the minimum over all incoming delay edges of the early mode AT at the source of the delay edge plus the early mode delay associated with that delay edge. The late mode AT represents the latest that the signal at the node can take on its final stable value during the current clock cycle and its value at a node is computed as the maximum over all incoming delay edges of the late mode AT at the source of the delay edge plus the late mode delay associated with that delay edge. Thus the "window" from the early mode AT to the late mode AT represents the period during which the signal at the node may be switching. Note that if many paths converge on the node, the signal at the node may switch many times during this window, it may switch only once, or not at all.

In analysis of the effects of signal coupling on delay and noise and in the analysis of peak current demand for power bus analysis, it is important to understand the times during which a signal can switch. To determine the effects of coupling on delay of a first wire, one must determine whether a neighboring wire is switching at the same time as a transition of interest is occurring in the first wire. To determine whether coupling to a first wire of the effects of a transition on an adjacent wire could cause an erroneous data to be imposed on the first wire and thus cause the circuit to produce incorrect results, it is important to understand the periods during which the results of erroneous values on the first wire could be saved into memory elements, and then to determine whether or not the adjacent wire may be switching during these periods. The time of occurrence of a transition of interest on a first wire for delay analysis, or the period during which noise coupled onto a first wire could cause erroneous results to be latched into some memory element for noise analysis, are referred to as the victim windows of the first wire for the respective analyses. In determining peak current demand, one must determine all of the signals within a region of interest which could be switching at a particular time, and must therefore determine the possible switching windows for each signal. The smaller these switching windows can be made, the less pessimistic are these analyses. However, conventional analysis only provides a single window for the static timing analysis. This requires that the window be unnecessarily large (e.g., overly pessimistic) to accommodate all possible timing situations. The invention discussed in detail below reduces the size of the window by using multiple windows. Therefore, the invention is less pessimistic than conventional systems because the smaller windows used with the invention result in a smaller number of possible simultaneous switching situations, thereby allowing more circuit designs to be found acceptable than the conventional systems that are more pessimistic and would reject more circuit designs. In the following description, the arrival, existence, or presence of a signal on a wire or net at a particular time or within a particular time window will be understood to mean the occurrence of a transition on that wire or net at that time or during that time window.

SUMMARY OF THE INVENTION

In view of the foregoing and other problems, disadvantages, and drawbacks of the conventional circuit timing analysis the present invention has been devised, and it is an object of the present invention to provide a structure and method for an improved circuit timing analysis.

In order to attain the object(s) suggested above, there is provided, according to one aspect of the invention, a method of determining timing windows in a static timing analysis of an integrated circuit design. The method determines, for at least one node in the integrated circuit design, an initial set of sub-windows and merges the sub-windows of the initial set into a final set of sub-windows. The merging process merges overlapping sub-windows. The invention further determines, for the at least one node, a maximum number of sub-windows. The merging process finds a set of largest intervals between the sub-windows of the initial set, the number of intervals in the set being less than or equal to one less than the maximum number of sub-windows and combines sub-windows separated by intervals not in the set of largest intervals. The method may perform an initial static timing analysis to produce a maximum window for the at least one node such that the maximum number of sub-windows is based on the size of the maximum window. The sub-windows are based on an equal division of the maximum window. The maximum window extends from a beginning of an earliest input signal to the node to an ending of latest input to the node. Each sub-window of the initial set of sub-windows extends an earliest beginning of a first input to the node to a latest ending of the first input. One set of timing windows are signal switching windows and computation of the windows is performed in a direction in which signals travel through the integrated circuit. Another set of timing windows are victim windows and the computation of the windows is performed in a direction opposite to that in which signals travel through the integrated circuit. The invention determines whether an adjacent aggressor net may switch during a victim window of a victim net in a static timing analysis of an integrated circuit design. The invention checks for overlap between the victim window and a switching window of the aggressor net and then translates the victim net to a context of each input of the aggressor net, if the checking step identified an overlap. Next, the invention repeats the checking process for each input and translated victim window and determines that the aggressor net may switch during the victim window only if the checking step found an overlap and at least one of the repeating steps determined that the input could switch during the translated victim window. The repeating step is repeated only for a limited number of levels. Each input is an aggressor sub-window, each relating to one input. The repeating process checks for overlap between each the aggressor sub-window and a related translated victim window. If the checking step identified an overlap, the invention determines an initial set of aggressor sub-windows and merges the aggressor sub-windows of the initial set into a final set of aggressor sub-windows. The repeating process checks for overlap between the translated victim window and each of the final set of aggressor sub-windows. The aggressor window determination is performed in a direction in which signals travel through the integrated circuit. The translated victim window determination is performed in a direction opposite that in which signals travel through the integrated circuit.

The invention provides improved switching windows for nets in a circuit which can be used in delay calculation, noise analysis, power bus analysis, and other applications, and which cover a smaller portion of the machine cycle and are thus less pessimistic than conventional single window analysis in that they identify a smaller cumulative period of time during which a net could be switching. At the same time, the invention provides means to control the runtime and memory required to compute these improved switching windows. These improved switching windows in turn allow less pessimistic analysis of the timing of the circuit, the noise impacts of coupling, and the peak current demand required by the circuit. This allows designers to accept designs which would otherwise be rejected as not meeting requirements, and allows circuit requirements to be met with less overdesign in the form of logic restructuring, wire spacing, increased gate sizes, and other means, hence providing a working circuit at less expense.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 9 is a schematic diagram illustrating switching windows for each window division;

FIG. 10 is a schematic diagram illustrating a circuit for switching probabilities computed in switching subwindows.

DETAILED DESCRIPTION OF PREFERRED EMBODIMENTS OF THE INVENTION

As mentioned above, the invention reduces the size of the signal switching window in a conventional circuit timing analysis by using multiple windows (or sub-windows). Therefore, the invention is less pessimistic than conventional systems because the smaller windows will result in a smaller number of possible simultaneous switching situations, thereby allowing more circuit designs to be found acceptable than the conventional systems (that are more pessimistic and that reject more circuit designs).

As discussed above, the switching window from early mode AT to late mode AT is sometimes pessimistic. Consider a two-input gate with a first input having an early mode AT of 0 ns. and a late mode AT of 50 ns, and with a second input having an early mode AT of 300 ns and a late mode AT of 350 ns. Conventional analysis (assuming zero gate delay for simplicity) would define a switching window from 0 ns to 350 ns for the gate output. But in reality no switching can occur between 50 ns and 300 ns. Thus, an analysis based on this larger window is pessimistic.

Figure 1:
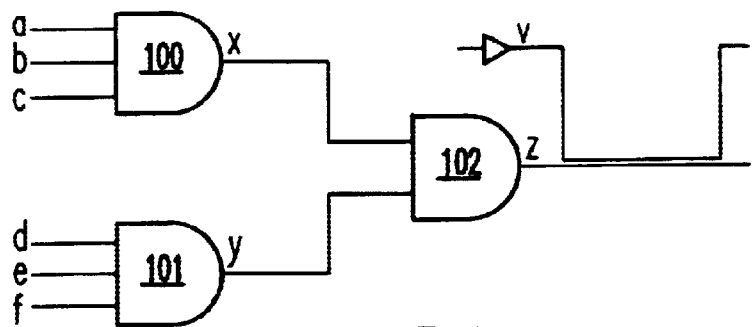
FIG. 1 is a schematic diagram of a circuit upon which a timing analysis is performed.
Figure 2:
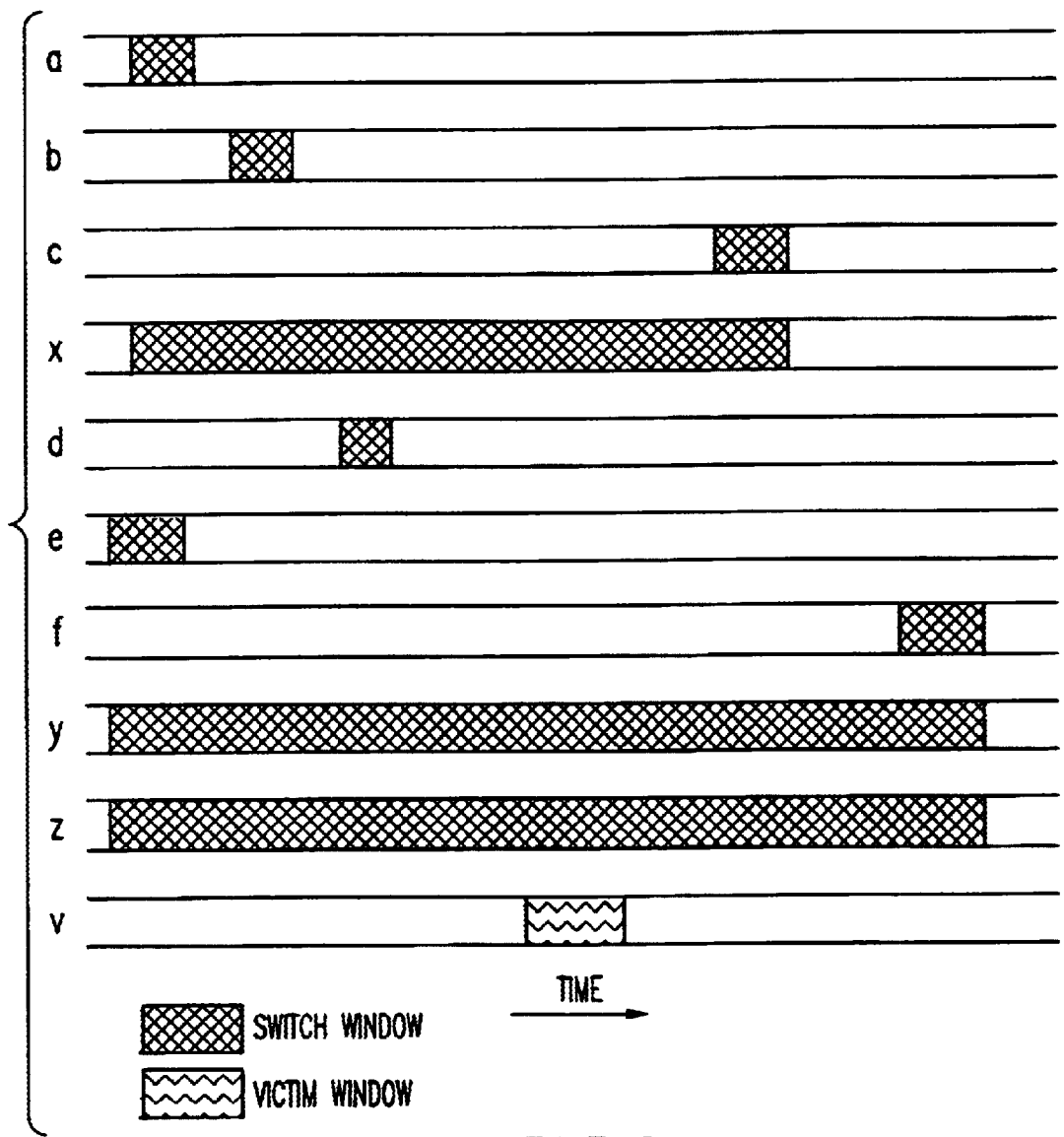
FIG. 2 is a schematic timing diagram illustrating various windows during which the signals within the circuit shown in FIG. 1 may be switching.

The switching window from early mode AT to late mode AT is shown as being pessimistic in FIG. 2. More specifically, FIG. 1 illustrates a simplified circuit that includes logic devices 100–102 that have inputs a–f and outputs x–z, and an adjacent wire v (of a different net). The logic devices x–z could be any form of logic device such as AND, OR, NAND, NOR, etc. circuits. FIG. 2 is a timing diagram illustrating time along the lower axis. The shaded areas illustrate time periods during which signals can be expected to exist on the various inputs a–f and outputs x–z and the period during which a critical transition might occur on adjacent wire v. FIG. 1 shows a simplified example, where it is presumed that the logic devices 100–102 do not produce any delay. As would be known by one ordinarily skilled in the art, such logic devices would include a certain amount of delay. However, in order to more clearly illustrate the invention, in this example, such logic devices are assumed to have zero delay.

In FIG. 2, signals a–c are shown to have different time windows (shaded areas) in which signals can be expected to be present. These shaded areas represent the time period between the earliest point in time that a signal could be expected to arrive from the fan-in circuitry to the latest point in time that a signal could be expected to arrive from the fan-in circuitry on a given signal line (a–c). The "single window" timing analysis concludes that the logic device 100 could receive a signal that any point in time from the beginning of the earliest signal (signal a) to the end of the last signal (signal c). Therefore, a large pessimistic shaded switching window is shown for the output signal x of logic item 100. Similarly, for logic item 101, the earliest signal could appear on line e and the latest could appear on line f and an even larger pessimistic window is created for logic item 101 on the output line y. Logic item 102 similarly looks to the large pessimistic windows for logic items 100, 101. Since the switching window for logic item 101 (line y) begins before that for logic item 100 (line x) and ends after that for logic item 100, the switching window for the output from logic item 102 (line z) is identical to that for logic item 101 (line y). As shown in FIG. 2, the switching window in line z overlaps the victim window v during which net v is sensitive to adjacent wire switching. Therefore, the single window analysis might compute a larger delay for net v, identify a noise problem on net v, or identify excessive peak current demand in the region containing nets Z and v, and therefore conclude that the circuit needs to be redesigned to avoid capacitive coupling that may occur between lines v and z. To the contrary, with the invention, multiple switching windows are utilized for the outputs x–z, as shown in FIG. 3 (discussed in greater detail below) which allows a determination that there is not an overlap between the switching window of the output of logic device 102 (lines z) and victim window of line v.

One way to solve the problem shown in FIG. 2 (e.g., to reduce the size of the switching window in line z) is to perform a path analysis, wherein separate switching windows are propagated to a node along each possible path from a primary input. However it is well-known that the number of paths through a logic network can grow exponentially, leading to an unacceptable number of separate switching windows which must be maintained at each node. Therefore, there is a need for an improved method to further refine these switching windows in a way which limits the amount of data which must be stored at each node.

The invention addresses this need with a basic idea of storing and propagating a limited set of sub-switching windows on each node in the analysis. Sub-switching windows are merged to control the number of windows on each node. An analysis using switching windows can then treat the sub-switching windows independently. Since the sum of the generated sub-switching windows will, in general, cover less of the clock cycle than the original single switching window, the pessimism of these analyses is reduced (as shown in FIG. 3).

Figure 3:
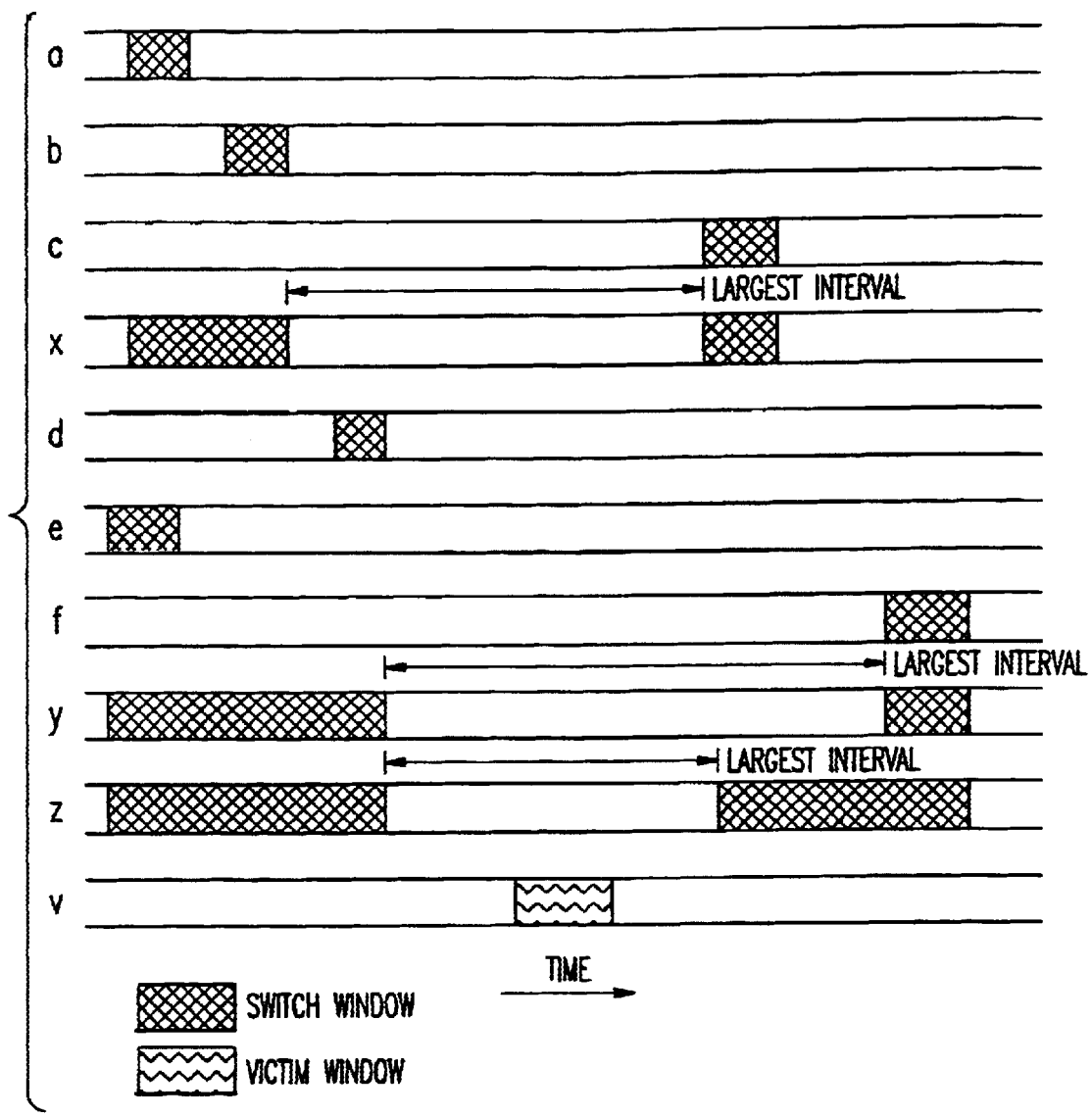
FIG. 3 is a schematic timing diagram illustrating the use of multiple windows and the reduced pessimism achieved with the invention.

For example, when signal lines x–z are compared between FIGS. 2 and 3 it can be seen that such signal lines include multiple windows in FIG. 3. Therefore, even when the switching windows of the signal lines x and y are combined, signal line z still maintains a gap which prevents overlap with the victim window line v. Therefore, contrary to the situation shown in FIG. 2, the invention shown in FIG. 3 correctly interprets that there is no overlap between any of signals a–f and the victim window v. The single window system in FIG. 2 creates too much pessimism by utilizing an over broad switching window. With the system shown in FIG. 3, since the switching windows are smaller, they are less pessimistic and correctly indicate that no signal will be concurrent with the victim signal v. Thus, with the invention, properly functioning circuit designs which were previously rejected (because of excessive pessimism in the timing analysis) can now be approved because of the decrease in pessimism with the invention.

In the simplified example of shown in FIG. 3, each signal line x–z is limited to two sub-windows. This limit can be changed depending upon designer requirements. Therefore, in line x, the signal switching windows on lines a and b are combined and the signal switching window shown on line c is unmodified. By making this combination, the largest interval is attained between the multiple windows on line x, and the sub-windows that are created are the smallest possible (given the two-window limit). Similarly, when the windows are created in line y, the windows from lines d and e are combined and the window from line f is unmodified.

In other words, with the invention, when selecting which windows should be combined from lines a–c, it is determined that from the end of the window in line b to the beginning of the window in line c exist the largest time interval. Note that the time interval between the end of the time window in-line a and the beginning of the time window in line b is relatively shorter than the largest interval between the windows in lines b and c. Therefore, the invention elects to combine the windows from lines a and b and to leave the window in line c unaltered. This satisfies the circuit designer's limit of two windows (discussed above), and also makes these windows as small as possible. As similarly shown in lines y and z, the invention finds the largest interval and forms a gap between the remaining switching windows in the largest interval. In this way, the invention makes the remaining switching windows as small as possible, thereby decreasing pessimism.

Thus, for any given limitation, the goal of the invention is to create the smallest sized sub-windows for the given total sub-window requirements. While a two sub-window maximum is shown in the example in FIG. 3, as would be known by one ordinarily skilled in the art, a larger number of sub-windows could easily be used and a two sub-window maximum is only shown for ease of illustration. Specifically, for an N-window maximum, the invention would order the incoming switching windows and would find and retain the N−1 largest intervals between adjacent non-overlapping switching windows. If there are only K<N−1 intervals between adjacent incoming switching windows, only K+1 switching windows would result from the merging process.

Figure 6:
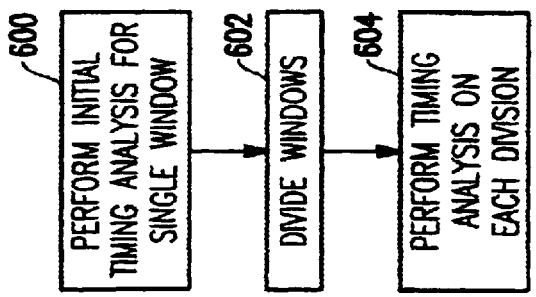
FIG. 6 is a flow diagram illustrating a preferred method of the invention.

The number of windows per node may be determined in different ways. First, as shown in the flowchart in FIG. 6, the invention performs an initial static timing analysis 600 and determines a single initial switching window for each node in the manner discussed above with respect to FIG. 2, using the early mode AT and late mode AT for the node. Then, the invention divides this single initial switching window 602. This is preferably performed by fixing the division size, in which case the number of divisions per node may vary, but will never exceed the cycle time of the circuit (i.e., the cycle time of the clock driving the latches within the circuit) divided by the division size. Alternatively, each window can be divided into an equal number of divisions, in which case the division size for each node may vary. FIG. 9 shows an example of this method applied to the window for signal x of the circuit shown in FIG. 1. The single window for x, resulting from the first timing analysis of step 600 in FIG. 6 is the same as that shown in FIG. 2, and covers the entire time from the beginning of the switching window for signal a to the end of the switching window for signal c. The window division line shows the results of dividing the cycle time of the circuit into four equal divisions w0, w1, w2, and w3, as specified in step 602 of FIG. 6. For example, if the cycle time for the circuit were 100 ns and it was desirable to limit the analysis to no more than four switching windows per net, each division might be 100 ns/4, or 25 ns long.

Next, in item 604, the invention performs a second static timing analysis during which a separate early and late mode ATs are computed for each division of the switching window. To do this, the invention determines for each delay edge i feeding a timing point (a point for which arrival times are computed) and for each sub-switching window j on the edge source, the incoming ATlate_ij (late mode AT of sub-window j at the source of edge i plus late mode edge delay of edge i) and ATearly_ij (early mode AT of sub-window j at the source of edge i plus early mode edge delay of edge i). The late mode AT for the timing point for a division is then the maximum of ATlate_ij over all i and j for which either ATlate_ij or ATearly_ij occur during the division. Similarly, the early mode AT for a division is then the minimum of ATearly_ij over all i and j for which either ATlate_ij or ATearly_ij occur during the division. The early and late mode ATs for each division then form a separate sub-switching window, with overlapping sub-windows for adjacent divisions (or optionally sub-windows for adjacent divisions which are separated by some small amount, e.g., less than the slew of the signal) being merged. The multiple windows line of FIG. 9 shows the switching windows for each of the window divisions resulting from the separate timing analyses performed according to step 604 of FIG. 6. Looking at the multiple windows line of FIG. 9, it can be seen that only inputs a and b can have switching events which could propagate to x during division w0, and thus the first window for x, occurring in division w0, bounds the transitions which could occur on x during w0 due to a and b. No inputs can have switching events which could propagate to x during division w1, and therefore no switching window is generated for division w1. Only input c can have switching events which could propagate to x during division w2, and thus the second of the windows for x, occurring in division w2, bounds the transitions which could occur on x during w2 due to c. Similarly, only input c can have switching events which could propagated to x during division w3, and thus the third window for x, occurring in division w3 and immediately adjacent to the window for division w2, bounds the transitions which could occur on x during w3 due to c. Because the switching windows for signal x for divisions w2 and w3 have no gap between them, they may be merged into a single switching window.

Figure 7:
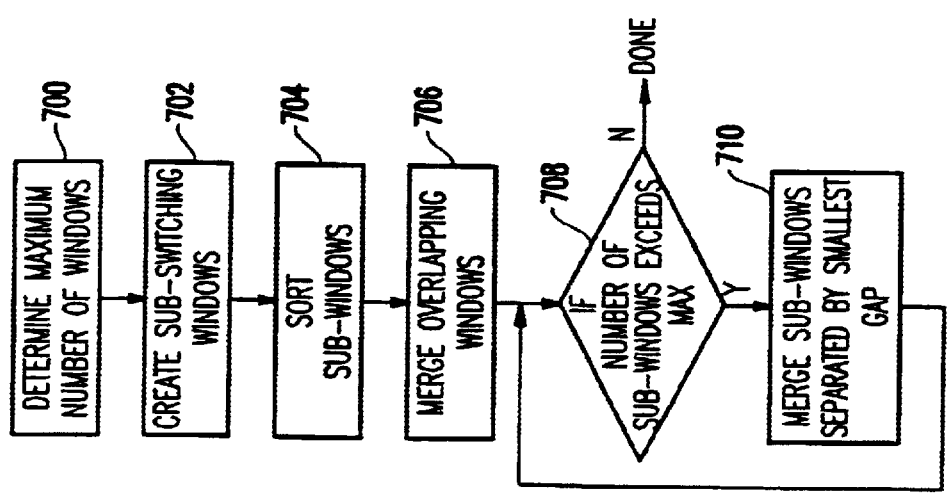
FIG. 7 is a flow diagram illustrating a preferred method of the invention.

In FIG. 7, an alternative (and preferred) process for determining the set of sub-windows for each node is shown. This process is applied to each node in the design in a topological sort order, as is done to compute ATs in conventional static timing analysis. Methods for ordering nodes in this manner are well known to those skilled in the art. In item 700, the invention determines some maximum number N of sub-switching windows which will be stored on the node, or a maximum merging gap (the maximum separation across which adjacent sub-windows for the node will be merged). This maximum value will typically be determined through a tradeoff between the run time and memory required by the analysis process and the accuracy (lack of pessimism) of the analysis results, and could be a control set by the designer which is applied to all nodes in the design. A reasonable upper bound on this value would be the cycle time of the circuit divided by twice the typical slew or transition time of signals in the circuit, since the additional inter-window gaps introduced by more than this number of windows on any signal would be unlikely to be large enough to prevent overlap with any potential victim nets. A specific value could also be set for a particular node based on the size of its undivided switching window, as determined by an optional prior step of static timing analysis.

Next, in item 702, the invention performs a static timing analysis during which each sub-switching window on an incoming delay edge is propagated separately (i.e., a resulting sub-window at the node due to an incoming sub-window at the source of an incoming delay edge is determined by adding the early mode delay of the delay edge to the early mode AT of the incoming sub-window, and adding the late mode delay of the delay edge to the late mode AT of the incoming sub-window) to create a set of sub-switching windows for the node. Thus, a separate sub-switching window is made for each sub-switching window of each incoming delay edge source. These sub-switching windows are sorted (e.g., by their beginning point) in step 704, and overlapping sub-windows (or optionally sub-windows which are separated by some small amount, e.g., less than the slew of the signal, or less than the specified maximum merging gap) are merged in step 706. In merging two windows a new window is created whose beginning point (early mode AT) is the minimum of the beginning points of the windows being merged, and whose end point (late mode AT) is the maximum of the end points of the windows being merged. In step 708 it is determined whether or not the number of sub-windows remaining for the node after merging exceeds N. If not, the processing of the node is finished. Otherwise, in step 710 the pair of adjacent windows separated by the smallest gap is merged, reducing the number of switching windows by one. The process then returns to step 708 and continues to merge pairs of windows until the remaining number of windows equals N. During this repeated process all but the largest N−1 inter-window intervals will be removed by merging the sub-windows.

This merging in step 710 can be done incrementally for each successive incoming delay edge. In this case the sub-switching windows at a node are initially the incoming sub-windows for the first incoming delay edge. The incoming sub-windows for the second incoming delay edge are combined with these as described above to produce a number of windows less than or equal to N, and this continues for each successive incoming delay edge to produce a final set of sub-windows for the node.

In some types of analysis it is desirable to determine the probability that a switching event occurs. Many methods for determining these probabilities use a zero delay model, in which only one possible switching event is considered on any circuit node within a single clock cycle (i.e., glitching, or multiple switching events within a cycle are ignored). By associating probabilities of occurrence with each sub-switching window, the present invention can be extended to determine the expected number of switching events in any clock cycle. These probabilities can be single numbers (in which case "spatial" correlation between different signals are ignored), or may be derived from logical functions (e.g., represented using binary decision diagrams (BDDS)) which identify the circumstances under which a switching event can occur within a given sub-window. The expected number of switching events on a node can then be estimated as the sum over all sub-switching windows for the node of the probability that a switching event occurs during the sub-window. Recall that both the single and partitioned switching windows represent times during which a signal could switch, but in any given machine cycle the signal may or may not switch during this period. Given the combining function for a node (i.e., the logical function of the gate of which the node is an output), the state probability (probability of being one) of each input signal to the node (i.e., the source node of each in-edge), and the probability that each input signal to the node is switching in each switching sub-window, similar state and switching probabilities can be computed for the node. This process can be repeated for each node using values computed for the sources of its in-edges, to provide state and switching probabilities for all nodes in the circuit.

Figure 11:
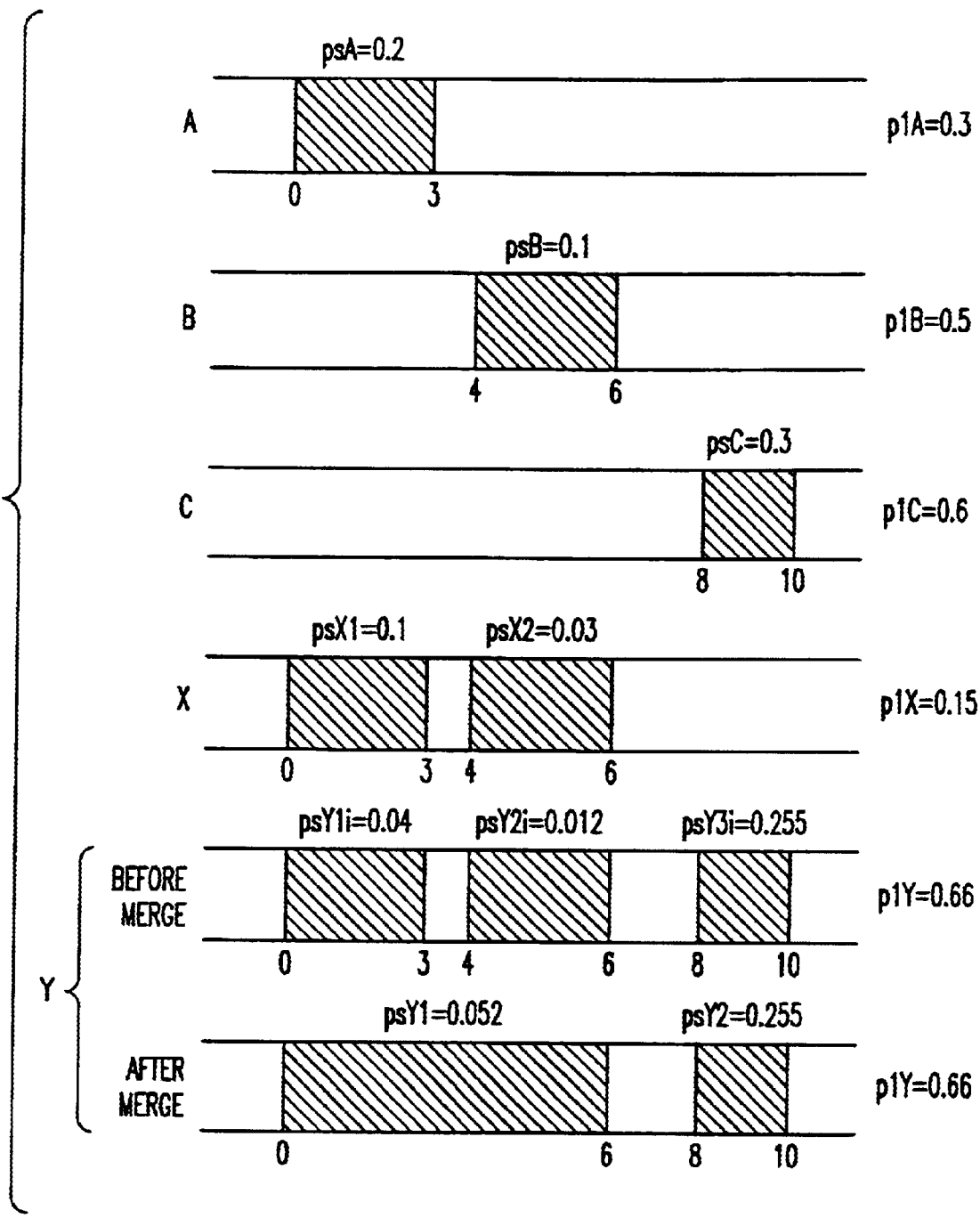
FIG. 11 is a timing diagram showing the operation of the invention.

FIG. 10 shows a circuit for which switching probabilities are computed in switching sub-windows. Gate delays are assumed to be zero for simplicity, each signal is allowed a maximum of two switching windows, and there is assumed to be no correlation between the primary inputs. The results of the switching window probability analysis are shown in FIG. 11. Because the output of AND gate 1000 is one only when both inputs are one, the state probability p1X of X is 0.3 times 0.5, or 0.15. Because the output of OR gate 1010 is one when either input is one, the state probability p1Y of Y is 1−[(1−0.15) times (1−0.6)], or 0.66. Two sub-windows are created for signal X. During the first sub-window of X, resulting from the switching window of A, the switching probability psX1 is 0.2 (the switching probability psA of A) times 0.5 (the probability p1B that B is a one, allowing the switching event from A to propagate), or 0.1. During the second sub-window of X, resulting from the switching window of B, the switching probability psX2 is 0.1 (the switching probability psB of B) times 0.3 (the probability p1A that A is a one, allowing the switching event from B to propagate), or 0.03. At Y three sub-windows are initially created. During the first initial sub-window of Y, resulting from the first sub-window of X, the switching probability psY1i is 0.1 (the switching probability psX1 of X) times 0.4 (the probability (1−p1C) that C is a zero, allowing the switching event from X to propagate), or 0.04. During the second initial sub-window of Y, resulting from the second sub-window of X, the switching probability psY2i is 0.03 (the switching probability psX2 of X) times 0.4 (the probability (1−p1C) that C is a zero, allowing the switching event from X to propagate), or 0.012. During the third sub-window of Y, resulting from the switching window of C, the switching probability psY3i is 0.3 (the switching probability psC of C) times 0.85 (the probability (1−p1X) that X is a zero, allowing the switching event from C to propagate), or 0.255. Since we are restricted to two sub-windows for Y, the first two initial sub-windows, which are separated by the smallest gap, are merged. Since these sub-windows did not overlap, the switching probabilities for them can be added to form a final switching probability psY1 for the merged sub-window of 0.052. The third initial switching window remains unchanged and becomes the second final switching window with switching probability psY2=psY3i=0.255. Had the merged sub-windows overlapped, the switching probability would be reduced to account for the fact that only a single switching event can occur at a time. The maximum reduction, for two totally overlapping sub-windows of short duration switching probabilities ps1 and ps2, would be ps1 times ps2. Sub-windows with intermediate levels of overlap would have lesser reductions in switching probability.

An additional method to obtain the sub-windows is referred to herein as demand-driven propagation, in which sub-windows are obtained at an aggressor node only if there is a need for more accuracy. More specifically, when a node is queried for multiple sub-windows, it results in recursive queries for sub-windows at each of the inputs feeding the node, and this may be unnecessary. The need for more accuracy is established by first performing a conventional timing analysis to provide single switching windows for each net in the design. More accuracy is required for a net if the victim window of an adjacent net (the time of a critical transition on the adjacent net for delay calculation, or a time at which the results of an erroneous value on the adjacent net may be stored in a memory element for noise analysis) overlaps with the single switching window of the net, or if the single switching window of the net overlaps a period during which excessive current demand is estimated for power bus analysis.

The sub-windows at the inputs are then used to create sub-windows at the node which are then merged using one of the methods described earlier (i.e., either with a limit on the number of sub-windows or on the time-interval between windows). As in the forward propagation method, the resulting sub-windows are preferably stored on the node (at least for the duration of the search for sub-windows for a particular aggressor node) so that they do not have to be determined again if the node is encountered a second time on some other backward search, from the same aggressor node or another. In this way, and by limiting the number of sub-windows stored at a node, exponential behavior is avoided.

This demand-driven propagation approach can also use an optional level-limiting parameter L that limits the number of backward levels that can be traversed for sub-window splitting. If a node is reached that is more than L levels from the aggressor node, only a single switching window (determined in the conventional way from the early and late mode arrival times) is used for that node. The invention preferably uses a recursive routine to compute switching windows, where the level limit is decremented with each level of recursive call. The invention terminates the recursion (and returns the simple switching windows) when the level limit reaches zero. In this case the number of levels searched to determine the sub-windows of a node should be stored along with the sub-windows for the node. If the node is encountered again (e.g., on a search backward from another aggressor) and the number of levels to search exceeds the number of levels used to obtain the present set of switching windows on a node, the old switching windows are discarded and new ones are found with the new level limit. To avoid unnecessary discarding and recomputation of switching windows, it is desirable to visit aggressor nodes in a levelized fashion, starting with those closest to the primary inputs.

Another variation on the demand-driven approach is to make a first pass backward from all aggressors, marking all nodes in their fan-in cones (e.g., by setting a bit flag in the data structure representing the node). The forward propagation method described above is then applied only to those nodes so marked. The marks will then indicate the nodes for which multiple sub-windows are to be computed.

The forward propagation approach (discussed initially above) has the advantage that sub-windows need to be computed only once, and can be used for any victim-aggressor pair. The disadvantage is that the limit on the number of sub-windows can limit the accuracy. Demand-driven propagation has the advantage that it can be invoked only for those aggressors which need sub-windows (and hence there can be more sub-windows allowed), but the disadvantage is that a large number of multiple sub-window computations might be performed for certain nodes (however, as discussed above, this can be controlled with a level limit).

In still another variation, instead of computing sub-windows on the aggressor independently of the victim as in the demand-driven propagation, a process termed backward victim window propagation is used where the aggressor node is simply queried for possible overlap with the victim. This query also results in queries on the input nodes to the aggressor, but the invention propagates the victim window backward, instead of propagating aggressor sub-windows forward, and the return value from the query is simply a yes or no answer as to whether possible overlap exists, rather than a forward propagated switching window. As in the demand-driven method, a level-limit can be employed in this approach too, to limit how far back the process goes in making these queries. One example of pseudocode for the backward victim window propagation approach is given below:

bool doesAggressorOverlap (aggressorNode, victimWindow, levelLimit) {if (victimWindow does not overlap aggressorNode window) return false; if (levelLimit==0) return true; for each edge e feeding aggressor Node do {if (doesAggressorOverlap (source(e), victimWindow−delay(e), levelLimit−1)){return true;}}return false;}

Figure 4:
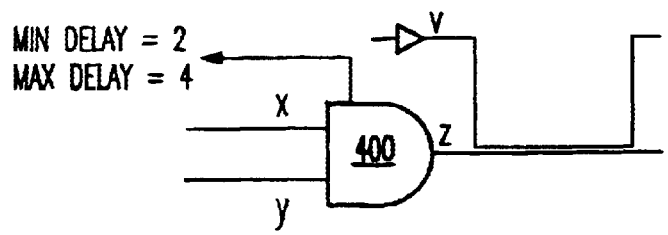
FIG. 4 is a schematic diagram of a circuit that is analyzed by a timing analysis.
Figure 5:
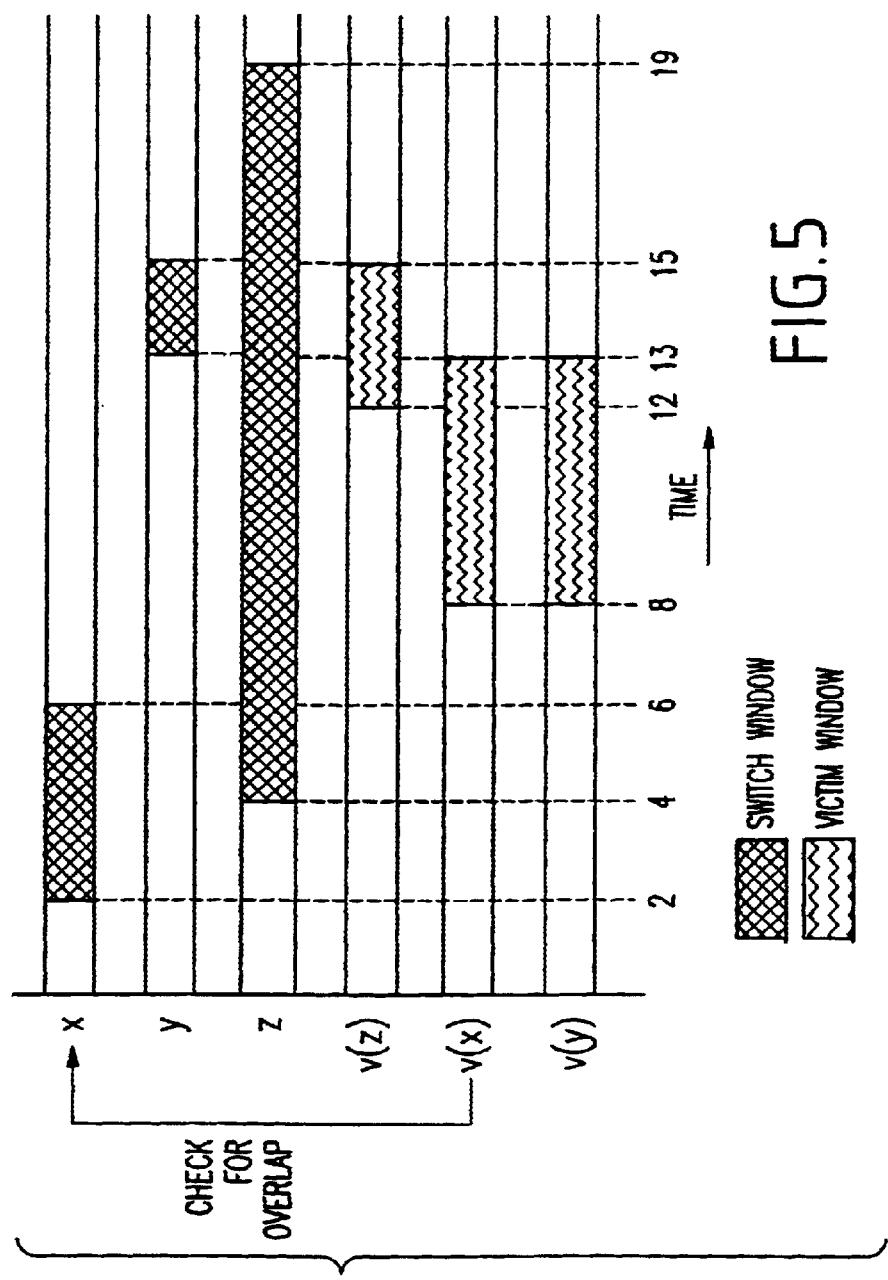
FIG. 5 is a schematic timing diagram illustrating the use of backward victim window propagation using multiple windows.

In the pseudocode above, the expression "victimWindow−delay(e)" represents the "equivalent" victim window at the input feeding the aggressor. The equivalent victim window represents that window with which the switching window of the input feeding the aggressor has to overlap, in order to generate a switching window at the aggressor that overlaps with the victim. The equivalent victim window is obtained by subtracting the minimum delay of the edge from the late mode arrival time, and the maximum delay from the early mode arrival time. If none of the inputs feeding the aggressor overlap with their corresponding equivalent victim window, then there is no overlap. Thus, recursion can be limited to only those branches of the fan-in cone from which there is potential overlap. Note that in this case the query result (which is now just a yes/no answer) cannot be stored on a node and reused, since the equivalent victim window at a node will in general be different for every aggressor/victim and for every path from the node to the aggressor. FIGS. 4 and 5 illustrate how the equivalent victim window is computed.

More specifically, in FIG. 4, item 40 represents a logical device having x and y inputs and a z output. Once again v represents the victim wire. The victim window v(z) might be the time at which a critical transition could be propagating along V, or might be a time at which the results of a noise-induced erroneous value on v could be stored into a memory element. Unlike FIG. 1, in FIG. 4, the logic device is provided with a delay (max 4, min 2). In conventional single window analysis this delay causes the beginning of the x switching window to be shifted 2 time units (from 2 to 4) to form the beginning of the z switching window and causes the end of the y switching window to be shifted 4 time units (from 15 to 19) to form the end of the z switching window. In this case the z single switching window is overly pessimistic.

Overlap checking is performed between the switching window of a net and the victim window translated back to the net. This is shown for net x in FIG. 5, and is similarly performed for the other nets. In this case the victim window v overlaps the switching window of the aggressor z (at times 12–15), so the invention recurses back to inputs x and y, and translates the victim windows v(x) and v(y) as shown. The beginning of the victim window v(z), 12, has subtracted from it the maximum gate delay of 4 to determine the earliest time, 8, at which an input on either x or y could cause a transition at z which would overlap the victim window v(z), thus determining the beginnings of the translated victim windows v(x) and v(y) at nodes x and y, respectively. The end of the victim window v(z), 15, has subtracted from it the minimum gate delay of 2 to determine the latest time, 13, at which an input on either x or y could cause a transition at z which would overlap the victim window v(z), thus determining the ends of the translated victim windows v(x) and v(y) at nodes x and y, respectively.

The translated victim window v(x) doesn't overlap the switching window of x, since the end of switching window x at 6 is less than or equal to the beginning of the translated victim window v(x) at 8, so the recursion on this branch terminates returning an answer of "no overlap". Similarly, the translated victim window v(y) doesn't overlap the switching window of y, since the beginning of switching window y at 13 is less or equal to the end of the translated victim window v(y) at 13, so the recursion on this branch terminates returning an answer of "no overlap". Since recursion from z to both inputs returned an answer of "no overlap", a final answer of "no overlap" is reported for z with respect to v(z). In addition the various features can be combined in many ways. For example, an initial forward pass can be used to generate a small number of switching windows on each node in the design, and then the backward recursive methods (demand-driven or backward victim window propagation) can make comparisons against all windows on a node rather than against a single (larger) window. A demand-driven method may be used to determine a small number of switching windows on only the nets in the aggressor fan-in cones, and a backward victim window propagation can then be used, comparing against the computed sub-windows Finally, the invention can propagate backward multiple victim windows at a time, combining the victim windows in a manner similar to the combining of aggressor windows described above. These combined victim windows could be used to guide the choice of aggressor windows to propagate forward (i.e., the invention would choose to combine aggressor windows in such a way that the resulting aggressor windows overlap maximally with the gaps in the victim windows, and the gaps in the aggressor windows overlap maximally with the victim windows). This backward and forward propagation could be repeated to successively refine both aggressor and victim windows, starting either with forward switching window propagation or backward combined victim window propagation. Any victim window which overlaps only with gaps in switching windows can be dropped, as can any switching window which overlaps only with gaps in the combined victim windows.

Figure 8:
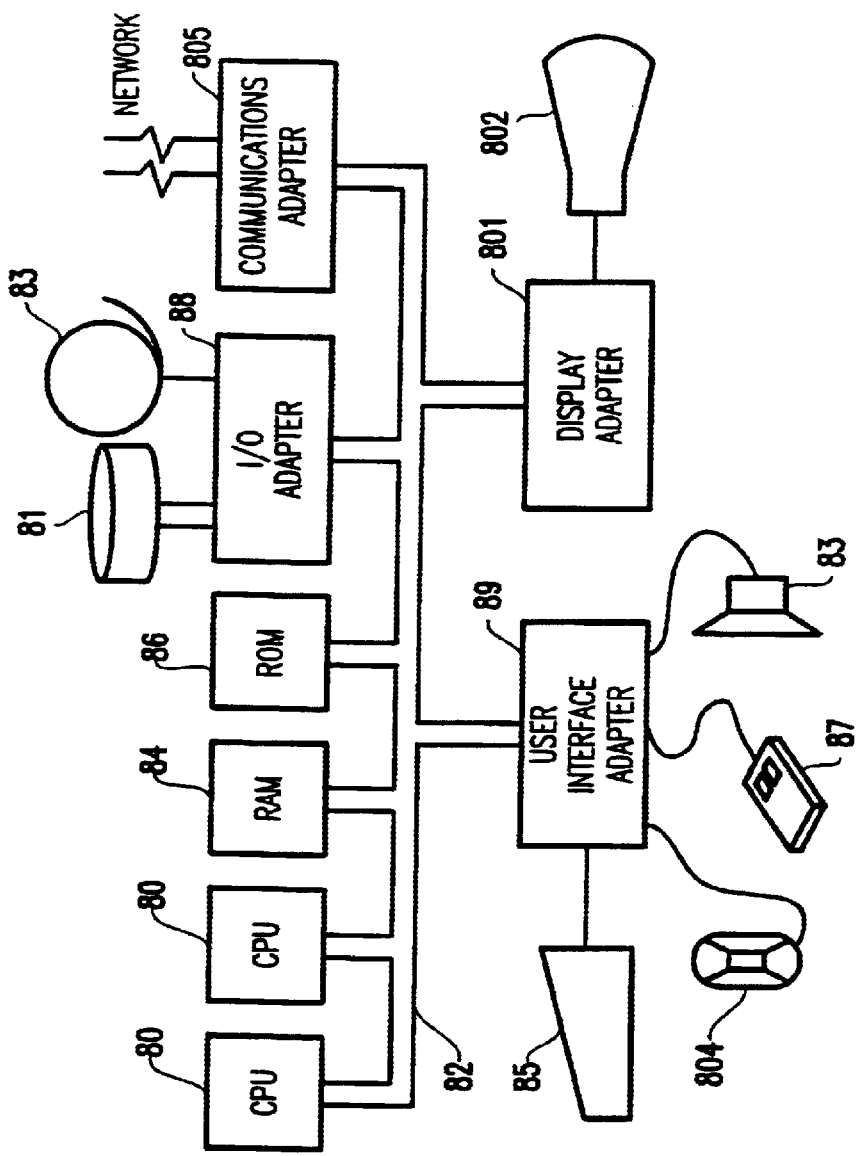
FIG. 8 is a system hardware illustration.

A representative hardware environment for practicing the present invention is depicted in FIG. 8, which illustrates a typical hardware configuration of an information handling/computer system in accordance with the subject invention, having at least one processor or central processing unit (CPU) 80. CPUs 80 are interconnected via system bus 82 to random access memory (RAM) 84, read-only memory (ROM) 86, an input/output (I/O) adapter 88 for connecting peripheral devices, such as disk units 81 and tape drives 83, to bus 82, user interface adapter 89 for connecting keyboard 85, mouse 87, speaker 83, microphone 804, and/or other user interface devices such as touch screen device (not shown) to bus 82, communication adapter 805 for connecting the information handling system to a data processing network, and display adapter 801 for connecting bus 82 to display device 802. A program storage device readable by the disk or tape units, is used to load the instructions which operate on a timing relationship which is loaded also loaded onto the computer system.

Through the above means, the invention provides improved switching windows for nets in a circuit which can be used in delay calculation, noise analysis, power bus analysis, and other applications, and which cover a smaller portion of the machine cycle and are thus less pessimistic than conventional single window analysis in that they identify a smaller cumulative period of time during which a net could be switching. At the same time, the invention provides means to control the runtime and memory required to compute these improved switching windows. These improved switching windows in turn allow less pessimistic analysis of the timing of the circuit, the noise impacts of coupling, and the peak current demand required by the circuit. This allows designers to accept designs which would otherwise be rejected as not meeting requirements, and allows circuit requirements to be met with less overdesign in the form of logic restructuring, wire spacing, increased gate sizes, and other means, hence providing a working circuit at less expense.

While the invention has been described in terms of preferred embodiments, those skilled in the art will recognize that the invention can be practiced with modification within the spirit and scope of the appended claims.

What is claimed is:

1. A method of determining timing windows in a static timing analysis of an integrated circuit design, said method comprising:

determining, for at least one node in said integrated circuit design, an initial set of sub-windows; and merging said sub-windows of said initial set into a final set of at least two sub-windows.

2. The method in claim 1, wherein said merging comprises merging overlapping sub-windows.

3. The method in claim 1, further comprising determining for said at least one node a maximum number of sub-windows.

4. The method of claim 3, wherein said merging comprises:

finding a set of largest intervals between said sub-windows of said initial set, the number of intervals in said set being less than or equal to one less than said maximum number of sub-windows; and combining sub-windows separated by intervals not in said set of largest intervals.

5. The method in claim 3, further comprising performing an initial static timing analysis to produce a maximum window for said at least one node.

6. The method in claim 5, wherein said maximum number of sub-windows is based on the size of said maximum window.

7. The method of claim 5, wherein said sub-windows are based on an equal division of said maximum window.

8. The method of claim 5, wherein said maximum window extends from a beginning of an earliest input signal to said node to an ending of latest input to said node.

9. The method in claim 1, wherein each sub-window of said initial set of sub-windows extends an earliest beginning of a first input to said node to a latest ending of said first input.

10. The method in claim 1, wherein said timing windows are signal switching windows and computation of said windows is performed in a direction in which signals travel through said integrated circuit.

11. A method of determining timing windows in a static timing analysis of an integrated circuit design, said method comprising:

determining, for at least one node in said integrated circuit design, an initial set of sub-windows; and merging said sub-windows of said initial set into a final set of at least two sub-windows, wherein said timing windows are victim windows and the computation of said windows is performed in a direction opposite to that in which signals travel through said integrated circuit.

12. A method of determining timing windows in a static timing analysis of an integrated circuit design, said method comprising:

determining, for at least one node in said integrated circuit design, an initial set of sub-windows;

merging said sub-windows of said initial set into a final set of sub-windows by finding a set of largest intervals between said sub-windows of said initial set, the number of intervals in said set being less than or equal to one less than said maximum number of sub-windows; and combining sub-windows separated by intervals not in said set of largest intervals.

13. The method in claim 12, wherein said merging comprises merging overlapping sub-windows.

14. The method in claim 12, further comprising determining for said at least one node a maximum number of sub-windows.

15. The method in claim 14, further comprising performing an initial static timing analysis to produce a maximum window for said at least one node.

16. The method in claim 15, wherein said maximum number of sub-windows is based on the size of said maximum window.

17. The method of claim 15, wherein said sub-windows are based on an equal division of said maximum window.

18. The method of claim 15, wherein said maximum window extends from a beginning of an earliest input signal to said node to an ending of latest input to said node.

19. The method in claim 12, wherein each sub-window of said initial set of sub-windows extends an earliest beginning of a first input to said node to a latest ending of said first input.

20. The method in claim 12, wherein said timing windows are signal switching windows and computation of said windows is performed in a direction in which signals travel through said integrated circuit.

21. The method in claim 12, wherein said timing windows are victim windows and the computation of said windows is performed in a direction opposite to that in which signals travel through said integrated circuit.

22. A method of determining whether an adjacent aggressor net may switch during a victim window of a victim net in a static timing analysis of an integrated circuit design, said method comprising:

a) checking for overlap between said victim window and a switching window of said aggressor net;

b) translating said victim net to a context of each input of said aggressor net, if said checking step identified an overlap;

c) determining an initial set of aggressor sub-windows, if said checking step identified an overlap, and merging said aggressor sub-windows of said initial set into a final set of aggressor sub-windows, d) repeating said checking for each said aggressor sub-windows and translated victim window; and e) determining that said aggressor net may switch during said victim window only if said checking step found an overlap and at least one of said repeating steps determined that said input could switch during said translated victim window.

23. The method of claim 22, wherein said repeating step is repeated only for a limited number of levels.

24. The method of claim 22, wherein each said input comprises an aggressor sub-window, each relating to one input.

25. The method of claim 24, wherein said repeating process checks for overlap between each said aggressor sub-window and a related translated victim window.

26. The method in claim 22, wherein said method is performed in a direction in which signals travel through said integrated circuit.

27. The method in claim 22, wherein said method is performed in a direction opposite that in which signals travel through said integrated circuit.

28. A program storage device readable by machine, tangibly embodying a program of instructions executable by the machine to perform a method of determining timing windows in a static timing analysis of an integrated circuit design, said method comprising:

determining, for at least one node in said integrated circuit design, an initial set of sub-windows; and merging said sub-windows of said initial set into a final set of at least two sub-windows.

29. The program storage device in claim 28, wherein said merging comprises merging overlapping sub-windows.

30. The program storage device in claim 28, wherein said method further comprises determining for said at least one node a maximum number of sub-windows.

31. The program storage device of claims 30, wherein said merging comprises:

finding a set of largest intervals between said sub-windows of said initial set, the number of intervals in said set being less than or equal to one less than said maximum number of sub-windows; and combining sub-windows separated by intervals not in said set of largest intervals.

32. The program storage device in claim 30, wherein said method further comprises performing an initial static timing analysis to produce a maximum window for said at least one node.

33. The program storage device in claim 32, wherein said maximum number of sub-windows is based on the size of said maximum window.

34. The program storage device of claim 32, wherein said sub-windows are based on an equal division of said maximum window.

35. The program storage device of claim 32, wherein said maximum window extends from a beginning of an earliest input signal to said node to an ending of latest input to said node.

36. The program storage device in claim 28, wherein each sub-window of said initial set of sub-windows extends an earliest beginning of a first input to said node to a latest ending of said first input.

37. The program storage device in claim 28, wherein said timing windows are signal switching windows and computation of said windows is performed in a direction in which signals travel through said integrated circuit.

38. A program storage device readable by machine, tangibly embodying a program of instructions executable by the machine to perform a method of determining timing windows in a static timing analysis of an integrated circuit design, said method comprising: determining, for at least one node in said integrated circuit design, an initial set of sub-windows: and merging said sub-windows of said initial set into a final set of at least two sub-windows, wherein said timing windows are victim windows and the computation of said windows is performed in a direction opposite to that in which signals travel through said integrated circuit.

\* \* \* \* \*